(12) United States Patent
Kikuchi

(10) Patent No.: US 8,310,591 B2
(45) Date of Patent: *Nov. 13, 2012

(54) IMAGE-TAKING APPARATUS

(75) Inventor: Hiroshi Kikuchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 348 days.

This patent is subject to a terminal disclaimer.

(21) Appl. No.: 12/717,544

(22) Filed: Mar. 4, 2010

(65) Prior Publication Data

US 2010/0171876 A1 Jul. 8, 2010

Related U.S. Application Data

(63) Continuation of application No. 10/895,034, filed on Jul. 21, 2004, now Pat. No. 7,701,505.

(30) Foreign Application Priority Data

Aug. 7, 2003 (JP) ................. 2003-288866

(51) Int. Cl.
*H04N 5/225* (2006.01)
(52) U.S. Cl. .................. 348/374; 348/373; 396/535
(58) Field of Classification Search .................. 348/374, 348/373; 396/535
See application file for complete search history.

(56) References Cited

U.S. PATENT DOCUMENTS

| 4,728,975 | A | 3/1988 | Ohara et al. |
| 6,330,400 | B1 | 12/2001 | Bittner et al. |
| 6,359,652 | B1 | 3/2002 | Takada |
| 6,678,471 | B2 | 1/2004 | Tomizawa |
| 6,721,014 | B1 | 4/2004 | Ariga |
| 6,829,011 | B1 | 12/2004 | Higuchi et al. |
| 6,856,766 | B2 | 2/2005 | Suzuki |
| 6,900,843 | B1 | 5/2005 | Uchiyama |
| 7,324,140 | B2 | 1/2008 | Kikuchi |
| 7,701,505 | B2 * | 4/2010 | Kikuchi .................. 348/374 |

FOREIGN PATENT DOCUMENTS

JP 2002-135631 5/2002

* cited by examiner

*Primary Examiner* — Sinh Tran
*Assistant Examiner* — Paul Berardesca
(74) *Attorney, Agent, or Firm* — Fitzpatrick, Cella, Harper & Scinto

(57) ABSTRACT

An image-taking apparatus includes a chassis which is disposed inside an outer package member of the image-taking apparatus and is a structural body of the image-taking apparatus, an image-pickup device which photoelectrically converts an object image, a first circuit which processes output signals from the image-pickup device, and a second circuit which generates an electromagnetic wave. Herein, the first circuit is disposed on the opposite side of the second circuit with respect to the chassis.

9 Claims, 7 Drawing Sheets

(PRIOR ART)

(PRIOR ART)

IMAGE-TAKING APPARATUS

This application is a 1.53(b) continuation of U.S. application Ser. No. 10/895,034, filed Jul. 21, 2004, pending.

This application claims priority from Japanese Patent Application No. 2003-288866 filed on Aug. 7, 2004, which is hereby incorporated by reference.

BACKGROUND OF THE INVENTION

1. Field of the Invention

The present invention relates to an image-taking apparatus having an image-pickup device which photoelectrically converts an object image.

2. Description of Related Art

Conventionally, an electronic camera is generally known which photoelectrically converts an object image incident on an image-pickup device such as a CCD, etc., from an image taking lens, and A/D converts and records the photoelectrically converted image signal on a recording medium, and further displays the image on a built-in liquid crystal monitor. Recently, this type of electronic camera, in which the lens barrel is interchangeable, has been widely used.

In this type of electronic camera, as in the case of a conventional silver halide film camera, small size, excellent operability, and high-speed continuous shooting have been demanded. In an electronic camera, image data is temporarily stored in a buffer memory (volatile memory), and then transferred and recorded on a recording medium, such as a memory card, that is loadable to and unloadable from the camera main body. Therefore, in comparison with a silver halide film camera, a large-sized electrical circuit using a number of electrical parts including an imaging circuit, an image processing circuit, and an image display circuit, etc., is installed inside the camera.

Particularly, in an electronic camera including a detachable lens barrel, it is required that the taken image has high image quality and the luminance range of the taken image is broad. Therefore, employment of a large pixel number and a high-sensitivity image-pickup device is required. Accordingly, an image-pickup device whose imaging area is large is used, and in response to this, the area of a circuit board to which the image-pickup device is connected is also increased. Therefore, it is difficult to arrange a plurality of circuit boards, to downsize the camera, and to improve the operability.

FIG. 6 and FIG. 7 show a conventional example (refer to Japanese Patent Application Laid-Open No. 2002-135631) of an electronic camera including a detachable lens barrel. In these drawings, Reference numeral 101 denotes a camera body, in which a battery 102 is disposed inside a grip portion 101a projecting forward.

Reference numeral 103 denotes a lens barrel detachably attached to a mount portion 105a provided on the front face of the camera, which retains an image taking lens 104. Reference numeral 105 denotes a minor box, and inside the minor box 105, a quick return minor 106 which guides light that has passed through the image taking lens 104 to a finder optical system is provided, and behind the quick return minor 106, a focal plane shutter 107 is provided. Reference numeral 108 denotes a penta-prism, and reference numeral 109 denotes a finder optical system for observing an object image.

Reference numeral 110 denotes a front chassis, which retains the minor box 105. Reference numeral 111 denotes a rear chassis, which is joined to the front chassis 110 by screws, etc. The entire camera is increased in mechanical strength by joining these chassis 110 and 111.

Reference numeral 112 denotes an image-pickup device which is disposed behind the focal plane shutter 107 and has an imaging plane perpendicular to an optical axis Lo, and an imaging circuit board 113 to which the image-pickup device 112 is connected is disposed in parallel to the imaging plane of the image-pickup device 112 as shown in the figures.

Behind the imaging circuit board 113, a first circuit board 114 is disposed, and ahead of the imaging circuit board 113, a second circuit board 115 and a third circuit board 116 are disposed. In the first circuit board 114, for example, a mechanism driving control circuit, an image processing circuit, and an image display circuit, etc., are installed.

In the second circuit board 115, a power supply circuit is installed, and in the third circuit board 116, a strobe circuit, etc., are installed.

Further behind the first circuit board 114, an illumination light source 117 and a liquid crystal display section 118 are disposed. Reference numeral 119 denotes a housing part in which a memory card as an external recording medium and a card connector are set, and the housing part is provided along the first circuit board 114 in a region between the first circuit board 114 and the battery 102.

In the above-described electronic camera, since the imaging circuit board 113 to which the image-pickup device 112 is connected, the first circuit board 114, the second circuit board 115, and the third circuit board 116 are disposed close to each other between the front chassis 110 and the rear chassis 111, in particular, an electromagnetic wave generated from the power supply circuit in the second circuit board 115 and the boost transformer of the flash circuit in the third circuit board 116 become noise and influence the circuits on other circuit boards.

Furthermore, since the front chassis 110 and the rear chassis 111 are installed, the thickness of the entire camera is increased. As a result, the camera is increased in size, and it becomes difficult to stably hold the camera when taking an image.

SUMMARY OF THE INVENTION

In view of these circumstances, an object of the present invention is to provide an image-taking apparatus such as an electronic camera which is hardly influenced by an electromagnetic wave generated from circuits installed inside and can maintain excellent image quality of taken images while being small in size and having excellent operability.

According to one aspect of the image-taking apparatus of the present invention, the image-taking apparatus comprises a chassis that is disposed inside an outer package member of the image-taking apparatus and is a structural body of the image-taking apparatus, an image-pickup device that photoelectrically converts an object image, a first circuit which processes output signals from the image-pickup device, and a second circuit which generates an electromagnetic wave. Herein, the first circuit is disposed on the opposite side of the second circuit with respect to the chassis.

The features of the image-taking apparatus of the present invention will be clarified by the following detailed description of embodiment with reference to the drawings.

DETAILED DESCRIPTION OF THE PREFERRED EMBODIMENTS

Hereinafter, an embodiment of the present invention is described in detail with reference to the drawings.

With reference to FIG. 1 through FIG. 5, an electronic camera (image-taking apparatus) of an embodiment of the present invention is described. To this electronic camera, a lens barrel is detachably attached.

Figure 1:
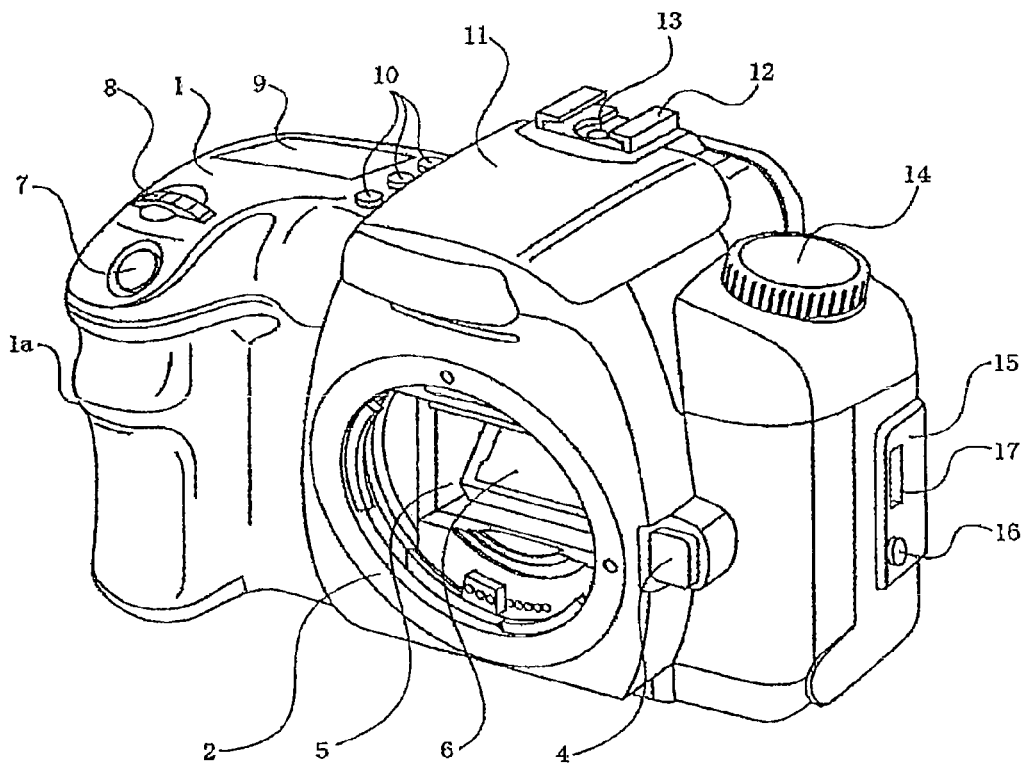
FIG. 1 is a perspective front view of an electronic camera of an embodiment of the present invention.
Figure 2:
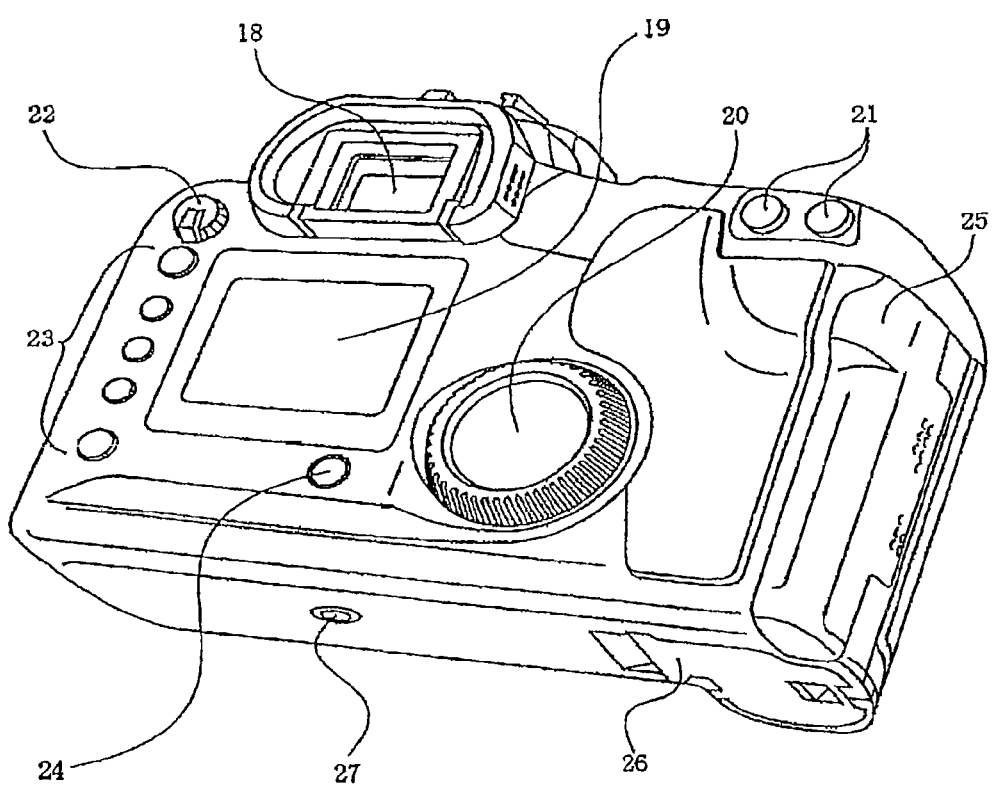
FIG. 2 is a perspective rear view of the electronic camera of the embodiment of the present invention.

First, the camera outer package is described with reference to FIG. 1 and FIG. 2. Herein, FIG. 1 is a perspective front view of the electronic camera, and FIG. 2 is a perspective rear view of the electronic camera. Reference numeral 1 denotes a camera outer package member, on which a grip portion 1a is provided to project forward of the camera so that a user easily and stably grips the camera when taking an image.

Reference numeral 2 denotes a mount portion, to which a lens barrel 3 (see FIG. 4 and FIG. 5) is detachably attached. Reference numeral 4 denotes a lens lock release button, and by pressing the lens lock release button 4, it is possible to detach the lens barrel 3 from the mount portion 2. Reference numeral 5 denotes a minor box disposed inside the outer package member 1, which is formed so as to surround a luminous flux that has entered from an image taking lens 30, and has a role of preventing the penetration of external light into the light flux from the image taking lens 30. Furthermore, the mirror box 5 has a quick return mirror 6 inside at an angle of 45 degrees from the optical axis to guide the light which has passed through the image taking lens 30 to a penta-prism 33.

On the left side of the camera top face (when viewed from the front side), a shutter button 7 as a start switch for starting image taking, a main operation dial 8 for setting a shutter speed and a lens f-number according to an operation mode of image taking, an LCD display panel 9 which indicates each operation mode of the camera, and a top face operation mode setting button 10 of an image taking system are disposed.

The top face operation mode setting button 10 is for making a setting as to whether the continuous shooting or image taking of only one frame is carried out by one depression of the shutter button 7, and setting of a self image taking mode, etc., and on the LCD display panel 9, the set conditions are displayed.

At the center of the camera top face, a flash unit 11 (illumination unit) which pops up from the camera body, a shoe groove part 12, and a synchro contact 13 for attaching an external flash are provided, and on the right of these, an image taking mode setting dial 14 is disposed.

On the right side face of the camera, an external terminal cover 15 is provided which covers an unillustrated housing part in a manner enabling it to open and close, and in this housing part, as external interfaces, a video signal outputting jack 16 and a USB outputting connector 17 are provided.

On the camera back face, a finder window part 18 is provided at the upper side of the optical axis center, and at the center of the camera back face, a color liquid crystal display unit 19 which can display images is provided. A sub operation dial 20 disposed by the side of the color liquid crystal display unit 19 takes an auxiliary role of the function of the main operation dial 8, and for example, in the AE mode of the camera, it is used for setting an amount of exposure correction according to a proper exposure value calculated by an automatic exposure device.

Or, in a manual mode in which the shutter speed and the lens f-number are set according to the user's intention, the shutter speed is set with the main operation dial 8, and the lens f-number is set with the sub operation dial 20. This sub operation dial 20 is also used as a display selecting means for taken images to be displayed on the color liquid crystal display unit 19.

Reference numeral 21 denotes a back face operation mode setting button, with which the AE lock can be set, and the setting conditions thereof are displayed on the LCD display panel 9 as well as the setting of the top face operation mode setting button 10.

Reference numeral 22 denotes a main power switch dial for supplying power to the camera, and it can be switched on and off by rotating the switch by a predetermined angle. On the left end when viewed from the back face of the color liquid crystal display unit 19, a push button unit 23 is disposed along the camera outer package, and by operating this push button unit 23, a menu for making various settings of the camera can be displayed and the display method of taken images can be changed.

Reference numeral 24 denotes a delete button for deleting image data temporarily stored in a recording medium, and is disposed apart from the push button unit 23 so as not to be depressed by mistake.

Reference numeral 25 denotes a card cover which covers an insertion opening of a memory card used as an external recording medium, described later, in a manner enabling it to open and close. By sliding and rotating the card cover 25 by a predetermined amount in a condition where the insertion opening is closed, the insertion opening can be opened.

Reference numeral 26 denotes a battery cover which covers a battery chamber which houses a battery, in a manner enabling it to open and close, and reference numeral 27 denotes a tripod attaching screw part for attaching a tripod which is not shown, which is provided on the camera bottom face.

Next, arrangement and working, etc., of the components of optical parts, the battery housing chamber, the circuit boards, and the memory card loading part inside the camera are described with reference to FIG. 3 through FIG. 5.

Figure 3:
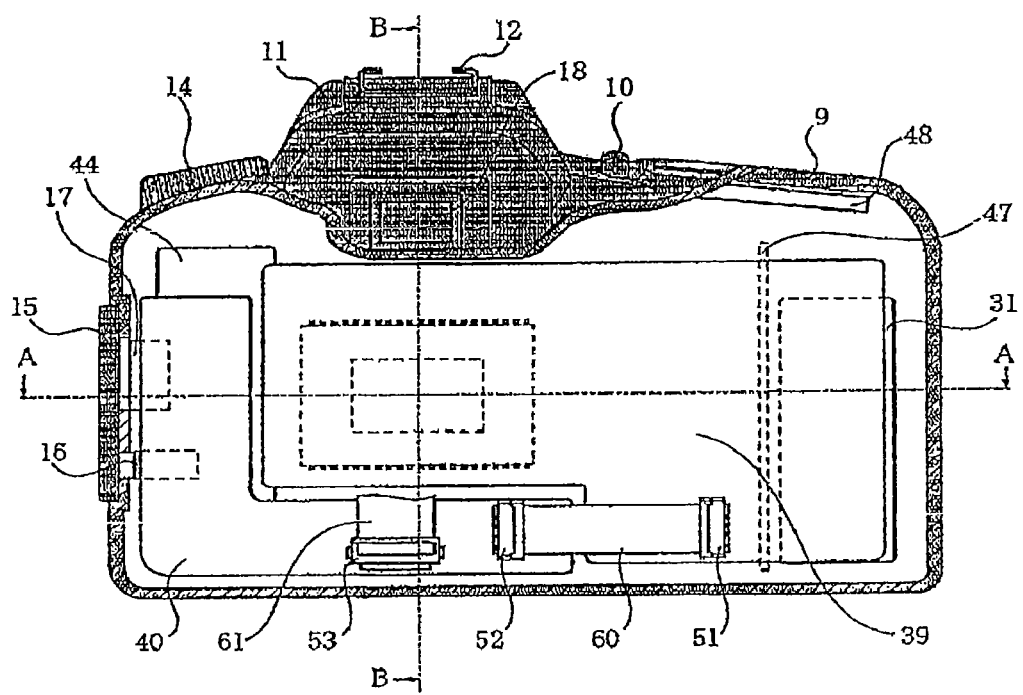
FIG. 3 is a rear view partially including a cross section of the electronic camera of the embodiment of the present invention.
Figure 4:
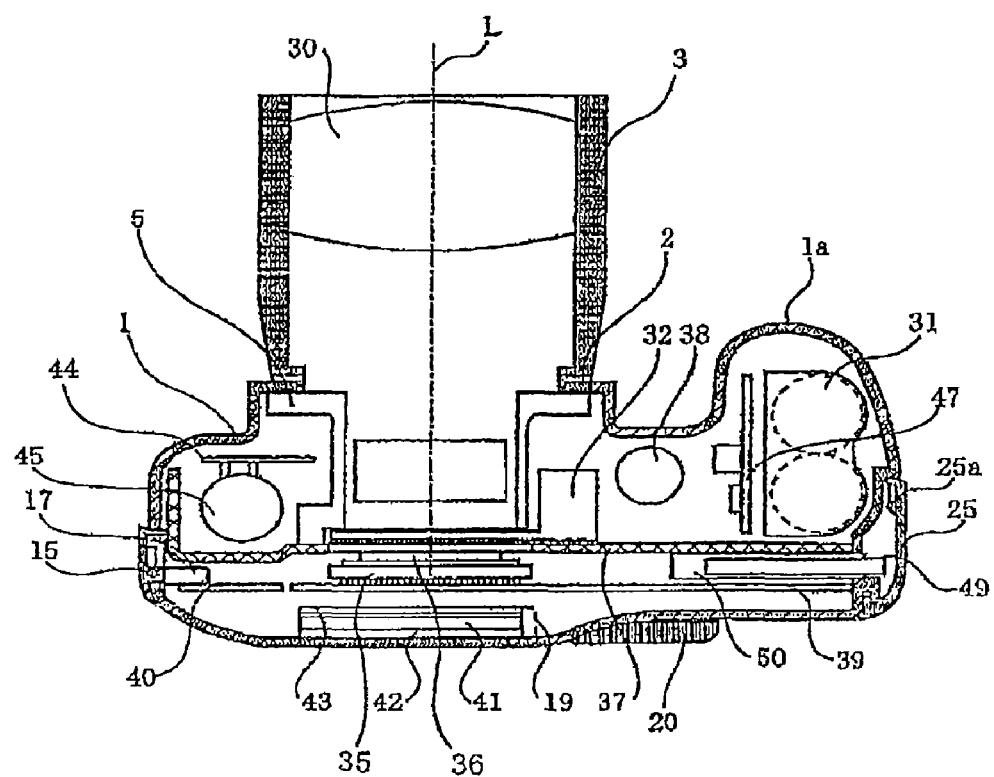
FIG. 4 is a cross sectional view along the A-A line of FIG. 3.
Figure 5:
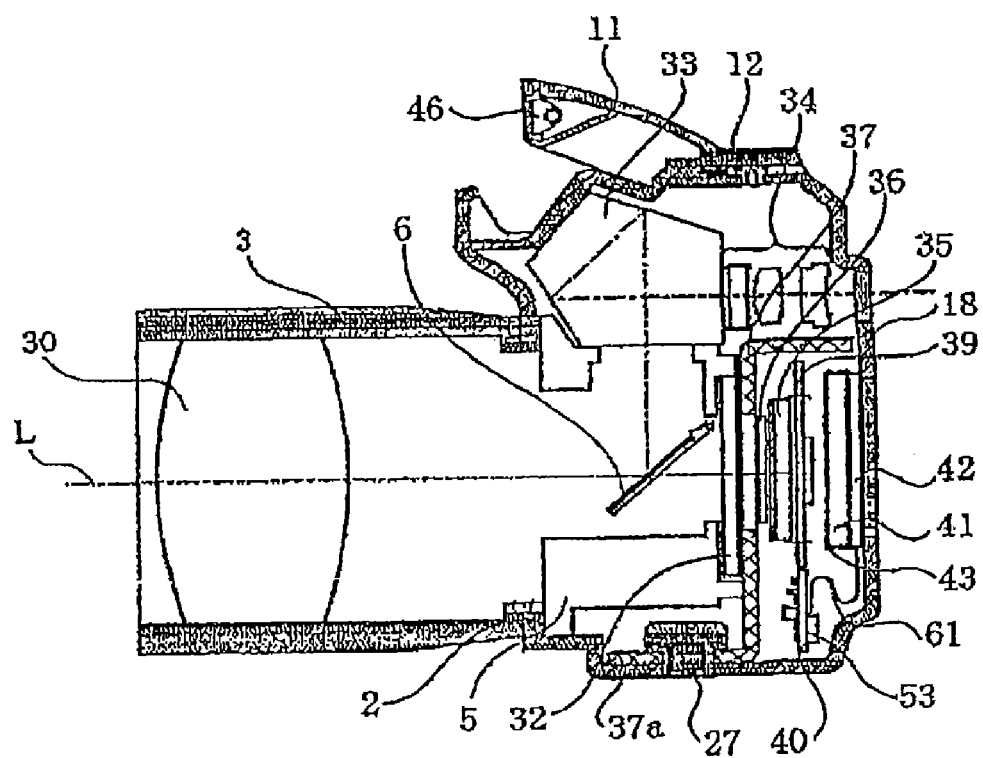
FIG. 5 is a cross sectional view along the B-B line of FIG. 3.
Figure 6:
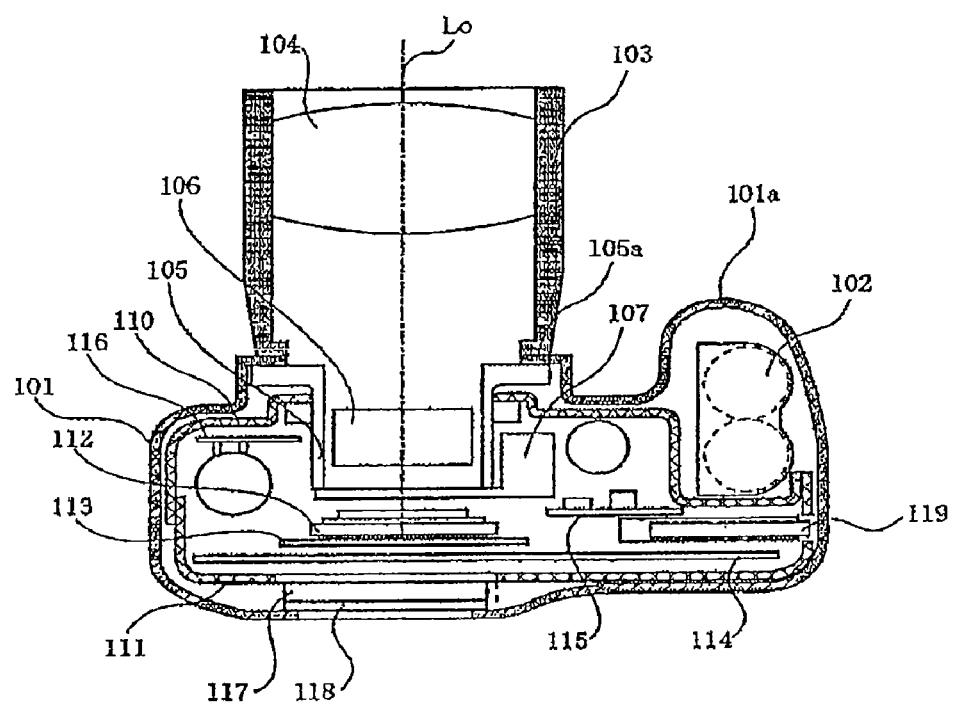
FIG. 6 is a horizontal sectional view of an electronic camera of a conventional example.
Figure 7:
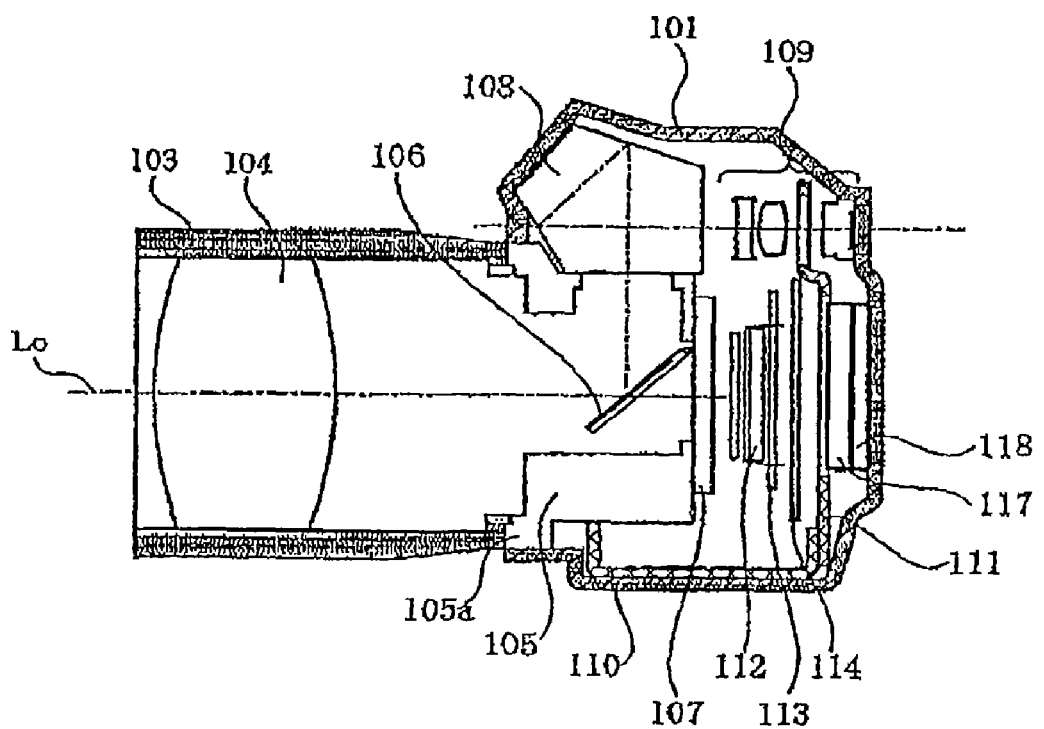
FIG. 7 is a vertical sectional view of the electronic camera of the conventional example shown in FIG. 6.

FIG. 3 is a rear view showing the inside of the camera by cutting the outer package member on the camera back face, FIG. 4 is a cross sectional view along the A-A line of FIG. 3, and FIG. 5 is a vertical sectional view along the B-B line of FIG. 3, including the lens optical axis, which shows a condition where the flash pops up.

In these figures, reference numeral 3 denotes a lens barrel attachable to and detachable from the camera, which retains an image taking lens 30. Inside the grip portion 1a projecting forward of the outer package member 1, a battery 31 as a power source is housed. Reference numeral 32 denotes a focal plane shutter, which is disposed behind a quick return mirror 6 and retained by a mirror box 5.

Reference numeral 33 denotes a penta-prism, reference numeral 34 denotes a finder optical system for observing an object image which has been inverted by the penta-prism 33. Reference numeral 35 denotes an image-pickup device which is disposed behind the focal plane shutter 32 and has an imaging plane perpendicular to the optical axis L, and converts the object image formed on the imaging plane into electrical imaging signals.

In front of the image-pickup device 35, an optical filter 36 is disposed in parallel to the imaging plane. Thus, by making an enclosed structure between the image-pickup device 35 and the optical filter 36, dust, etc., is prevented from entering between the imaging plane of the image-pickup device 35 and the optical filter 36. The image-pickup device 35 has scattering in the imaging plane, that is, the position and inclination of the sensor chip face with respect to the package outline, so that in the process of mass production of the camera, correlative positions of the image taking lens 30 and the sensor chip face must be adjusted and matched, so that the image-pickup device unit is attached to the minor box 5 after this positional adjustment.

Reference numeral 37 denotes a main chassis which is formed by machining a metallic material and can function as an electromagnetic wave shield, and is disposed in parallel to the imaging plane of the image-pickup device 35.

This main chassis 37 is securely fastened to the mirror box 5 by screws, etc., and forms a frame structure which provides strength for the entirety of the camera in conjunction with the minor box 5. The main chassis 37 has a role of supporting the outer package member 1 and the circuit boards 39 through 47. On the bottom face of the camera, a bent part 37a is formed by bending a part of the main chassis 37 forward, and the above-mentioned tripod attaching screw 27 is formed there.

Reference numeral 38 denotes a motor, which is a drive source of charging of the focal plane shutter 32, the rising and lowering operations of the quick return mirror, and the pop-up operations of the flash, and is retained by the mirror box 5.

Reference numeral 39 denotes an imaging signal processing circuit board (first circuit), which is connected to the image-pickup device 35 and disposed in parallel to the imaging plane as shown in the figure. In the imaging signal processing circuit board 39, an electrical circuit which samples, amplifies, and A/D converts output signals of the image-pickup device 35, an electrical circuit which applies predetermined processing such as white balance adjustment, exposure adjustment, gamma correction, etc., to image signals, a memory control circuit which stores the digital image signals in an internal memory or controls readout operations, and an electrical circuit which controls the entirety of the camera, are installed.

Reference numeral 40 denotes an image display circuit board (first circuit), which is disposed on the left side (opposite side of the grip 1a) of the camera within substantially the same plane as the imaging signal processing circuit board 39.

In the image display circuit board 40, a driver circuit of a color liquid crystal monitor 41 which is described later is installed, and video output signals are transmitted to the color liquid crystal monitor 41 and taken images are displayed on the monitor screen. Furthermore, on the image display circuit board 40, the video signal outputting jack 16 and the USB outputting connector 17 as external interfaces described in FIG. 1 are mounted, and a circuit of a video encoder, etc., which converts digital image signals into video signals and an external interface bus are wired.

Behind the imaging signal processing circuit board 39, a color liquid crystal display unit 19 is disposed. The color liquid crystal display unit 19 comprises an illumination light source 42, a color liquid crystal monitor 41, and an opening window part of the outer package member 1. The illumination light source 41 and the color liquid crystal monitor 42 are housed in a steel plate case 43.

Reference numeral 44 denotes a flash circuit board (second circuit), which is disposed on the left side of the mirror box 5 in parallel to the imaging signal processing circuit board 39. To the flash circuit board 44, a main capacitor 45 for charging is connected, and a control circuit which controls charging into this main capacitor 45 and controls the emission part 46 of the flash unit 11 are installed inside.

Reference numeral 47 denotes a power supply circuit board (second circuit), and is disposed side by side with the power battery 31 inside of the grip portion 1a. In the power supply circuit board 47, a DC/DC converter circuit is formed, which converts an output voltage from the power battery 31 into supplying voltages according to the respective circuits.

Reference numeral 48 denotes an LCD for external display, which is disposed along the outer package face of the outer package member 1 at the upper side close to the grip portion 1a. On the LCD 48 for external display, a shutter speed, a lens f-number, a number of images to be taken, the condition of the operation mode set in the camera, and the remaining amount of the battery capacity, etc., are displayed.

Reference numeral 49 denotes a memory card as an external recording medium to be inserted from the insertion opening which is not shown, and reference numeral 50 denotes a card connector which the memory card 49 inserted from the insertion opening is connected to and is provided between the main chassis 37 and the imaging signal processing circuit board 39 along the imaging signal processing circuit board 39.

The insertion opening is covered by the card cover 25 in a manner enabling it to open and close, and from a condition where the insertion opening is closed, the card cover 25 is pulled rearward of the camera along the optical axis and rotated counterclockwise (see FIG. 4) around a hinge 25a as a rotation center, whereby the cover is opened.

Next, the positional relationship of the circuit boards and the main chassis and the connection status of the circuit boards are described.

The imaging signal processing circuit board 39 perpendicular to the optical axis and the image display circuit board 40 are disposed substantially within the same plane, and are connected between a connector 51 mounted on the imaging signal processing circuit board 39 and a connector 52 mounted on the image display circuit board 40 by a flexible printed wiring board 60.

Furthermore, on the image display circuit board 40, a connector 53 is mounted, and is connected to the color liquid crystal monitor 42 by a flexible printed wiring board 61.

The imaging signal processing circuit board 39 to which the image-pickup device 35 is connected and the image display circuit board 40 are disposed substantially in parallel behind the main chassis 37. This arrangement makes it possible to make the board area most compact, and this is suitable for arrangement of the imaging signal processing circuit 39 comprising large-sized electrical circuits.

A flash circuit board 44 is disposed in parallel to the imaging signal processing circuit board 39 and positioned in front of the main chassis 37.

The power supply circuit board 47 is disposed perpendicularly to the imaging signal processing circuit board 39 and positioned in front of the main chassis 37. The flash circuit board 44 and the power supply circuit board 47 are disposed on both the left and right sides of the minor box 5 in the direction orthogonal to the optical axis.

By providing the imaging signal processing circuit board 39 and the image display circuit board 40 on the opposite side of the power supply circuit board 47 and the flash circuit board 44 across the main chassis 37, without using a shield case which is conventionally used to cover the circuit boards, an electromagnetic wave generated from the flash circuit board 44 and the power supply circuit board 47 are prevented from entering the circuits on the imaging signal processing circuit board 39 as noise. As a result, problems with the imaging signals and the deterioration in image quality can be prevented.

Furthermore, by disposing the imaging signal processing circuit board 39 and the image display circuit board 40 on the opposite side of the motor 38 across the main chassis 37 as described above, an electromagnetic wave generated during driving of the motor 38 are prevented from entering the imaging signals as noise. As a result, taken images can be prevented from deteriorating.

Next, operations of imaging and image reproduction, etc., in the electronic camera of this embodiment structured as mentioned above are described.

In the imaging standby state, the quick return minor 6 inside the minor box 5 is retained at an angle of 45 degrees—to the optical axis L. Then, it reflects and guides light which has passed through the image taking lens 30 to the pentaprism 33, and the light is further guided to the finder window part 18 from the finder optical system 34, whereby a user can observe the object image. At this point, the focal plane shutter 32 is closed.

When the user depresses the shutter button 7, according to predetermined control, AF and AE operations are started, and then the quick return mirror 6 rises and withdraws to the outside of the image taking optical path.

Thereafter, the focal plane shutter 32 opens and the image of the light which has passed through the image taking lens 30 is formed on the image-pickup device 35. Operations of the mechanical parts up to this point are the same as in a camera which uses a conventional silver halide film and is detachably attached with a lens barrel.

The object image formed on the image plane of the image-pickup device 35 is converted into imaging electrical signals. Thereafter, the signals are amplified and A/D converted, and then transmitted to the imaging signal processing circuit board 39. Then, the image signals are subjected to predetermined processing such as white balance adjustment, exposure adjustment, and gamma correction, etc., and the image data is recorded on an internal memory or the memory card 49.

As an image reproduction operation after image taking, image data which has been recorded on the memory card 49 can be displayed on the color liquid crystal monitor 42. The image data which has been recorded on the memory card 49 is converted into video signals by a video encoder and outputted.

Or, the image data is outputted as digital signals according to the USB standards by a digital interface, and can be transmitted to a television monitor or a personal computer via the corresponding video signal outputting jack 16 and the USB outputting connector 17.

In the embodiment mentioned above, the main chassis parallel to the imaging plane is described, however, the invention is not limited to this arrangement and it is possible that the main chassis is disposed perpendicularly to the imaging plane and horizontally to the camera bottom face, the power supply circuit board and the imaging signal processing circuit board are disposed at the upper side and the lower side of the camera across the main chassis, respectively.

In addition, as the shielding member surrounding the image taking optical path up to the imaging plane of the image-pickup device, the mirror box 5 is described, however, the invention is not limited to this, and it is also possible that the frame structural body of the entire camera is formed by joining a lens barrel retaining the image taking lens, in particular, a fixed barrel in the lens barrel which can advance and retreat in the optical axis direction to the main chassis 37.

According to the abovementioned embodiment, between the imaging signal processing circuit board 39 on which a circuit which processes electrical signals outputted from the image-pickup device 35 is mounted and the electrical circuit board 47 which supplies power to the image-pickup apparatus, the main chassis 37 formed of a metal plate having a function of shielding an electromagnetic wave is disposed, so that an electromagnetic wave generated from the power supply circuit can be prevented from influencing output signals of the imaging signal processing circuit 39 as noise while suppressing the increase in thickness of the entirety of the camera. Thereby, the quality of taken images can be excellently maintained.

Furthermore, since the main chassis 37 formed of a metal plate having a function of shielding an electromagnetic wave is disposed between the imaging signal processing circuit board 39 and the flash circuit board 44, an electromagnetic wave generated from the flash circuit board 44 during charging can be prevented from influencing output signals of the imaging signal processing circuit 39 as noise while suppressing the increase in thickness of the entirety of the camera. As a result, image data can be readout simultaneously with flash charging, whereby a camera with a high data processing rate can be provided.

Furthermore, since the main chassis formed of a metal plate is disposed between the imaging signal processing circuit board on which a circuit that processes electrical signals outputted from the image-pickup device is mounted and the motor serving as a drive source of the driving mechanism, noise generated from the motor is prevented from influencing the imaging signal processing circuit, the quality of taken images can be excellently maintained, and the image data readout operation can be carried out even while the motor is driven.

Furthermore, by the main chassis 37 of the present embodiment, an electromagnetic wave generated from a transmission circuit (second circuit) which is not shown and communicates with, for example, an accessory (external flash, etc.) can be prevented from entering the imaging signal processing circuit board 39 as noise.

While preferred embodiment has been described, it is to be understood that modification and variation of the present invention may be made without departing from scope of the following claims.

What is claimed is:

1. An image-taking apparatus, comprising:
   an outer package member of the image-taking apparatus;
   a chassis that is disposed inside the outer package member and is composed of a material having a function of an electromagnetic wave shield;
   an image-pickup device that photoelectrically converts an object image into a signal;
   an imaging signal processing circuit that processes the signal output from the image pickup device;
   a mirror box that is attached to a first surface of the chassis and has a mirror moving with respect to an image taking optical path;
   a motor that drives the mirror; and
   a strobe circuit that controls a strobe,
   wherein the motor and the strobe circuit are arranged in a first space between a front face of the outer package member and the first surface of the chassis, and
   wherein the imaging signal processing circuit is arranged in a second space between a rear face of the outer package member and a second surface of the chassis to which the mirror box is not attached.

2. The image-taking apparatus according to claim 1, wherein the strobe circuit is connected to a capacitor accumulating electrical energy to make the strobe emit light and control charging of the capacitor.

3. The image-taking apparatus according to claim 1, further comprising a power supply circuit that supplies power to the image-taking apparatus,
wherein the motor and the power supply circuit are arranged in a space surrounded by the outer package member, the minor box and the first surface of the chassis.

4. The image taking apparatus according to claim 1, wherein the outer package member is fixed on the chassis.

5. The image taking apparatus according to claim 1,
wherein the motor is arranged in a space surrounded by the front face of the outer package member, the first surface of the chassis and one side surface of mirror box, and
wherein the strobe circuit is arranged in a space surrounded by the front face of the outer package member, the first surface of the chassis and another side surface of the mirror box in the first space.

6. An image-taking apparatus, comprising:
an image-pickup device that photoelectrically converts an object image into a signal;
an imaging signal processing circuit that processes the signal output from the image-pickup device;
an outer package member of the image-taking apparatus;
a chassis that is disposed inside the outer package member and is composed of a material having a function of an electromagnetic wave shield;
a mirror box that is attached to a first surface of the chassis and has a minor moving with respect to an image taking optical path;
a power supply circuit that supplies power to the image-taking apparatus; and
a strobe circuit that controls a strobe,
wherein the power supply circuit and the strobe circuit are arranged in a first space between a front face of the outer package member and the first surface of the chassis, and the imaging signal processing circuit is arranged in a second space between a rear face of the outer package member and a second surface of the chassis to which the minor box is not attached.

7. The image-taking apparatus according to claim 6, further comprising a motor that drives the mirror,
wherein the power supply circuit and the motor are arranged in a space surrounded by the outer package member, the minor box and the first surface of the chassis.

8. The image taking apparatus according to claim 6, wherein the outer package member is fixed on the chassis.

9. The image taking apparatus according to claim 6,
wherein the power supply circuit is arranged in a space surrounded by the front face of the outer package member, the first surface of the chassis and one side surface of mirror box, and
wherein the strobe circuit is arranged in a space surrounded by the front face of the outer package member, the first surface of the chassis and another side surface of minor box in the first space.

\* \* \* \* \*